United States Patent [19]

Nyberg et al.

[11] Patent Number: 5,521,526
[45] Date of Patent: May 28, 1996

[54] METHOD AND A DEVICE FOR CHECKING THE CONDITION OF SEMICONDUCTOR VALVES

[75] Inventors: Krister Nyberg, Smedjebacken; Ari Seppänen, Ludvika, both of Sweden

[73] Assignee: ASEA Brown Boveri AB, Västerås, Sweden

[21] Appl. No.: 379,595

[22] PCT Filed: Aug. 11, 1993

[86] PCT No.: PCT/SE93/00662

§ 371 Date: Feb. 2, 1995

§ 102(e) Date: Feb. 2, 1995

[87] PCT Pub. No.: WO94/06028

PCT Pub. Date: Mar. 17, 1994

[30] Foreign Application Priority Data

Aug. 31, 1992 [SE] Sweden ................................ 9202500

[51] Int. Cl.⁶ .................................................. G01R 31/26
[52] U.S. Cl. .................................... 324/765; 340/635
[58] Field of Search .................................. 324/765, 766; 363/54; 340/635, 644, 645, 653

[56] References Cited

U.S. PATENT DOCUMENTS

| 4,471,301 | 9/1984 | Durov et al. | 324/766 |
| 4,600,917 | 7/1986 | Seki et al. | 363/54 |
| 4,651,088 | 3/1987 | Sawada | 324/765 |

Primary Examiner—Ernest F. Karlsen
Assistant Examiner—Russell M. Kobert
Attorney, Agent, or Firm—Watson Cole Stevens Davis

[57] ABSTRACT

An electric semiconductor valve (V), for example a valve in a converter for conversion between alternating current and high-voltage direct current, comprises a plurality of semiconductor positions (TS1, TS2, . . . TSN) with mutually series-connected semiconductor devices (T1, T2, . . . TN). With the semiconductor valve energized by an alternating voltage substantially corresponding to the rated voltage thereof, the condition of an optional semiconductor position is checked by generating a test firing signal (FP) and supplying it to the firing channel (L, 1, TCU, 3) of the semiconductor position alone, whereupon an indicating signal (IP) delivered by the indicating channel (TCU, 2, D) of the semiconductor position is studied with respect to time.

18 Claims, 7 Drawing Sheets

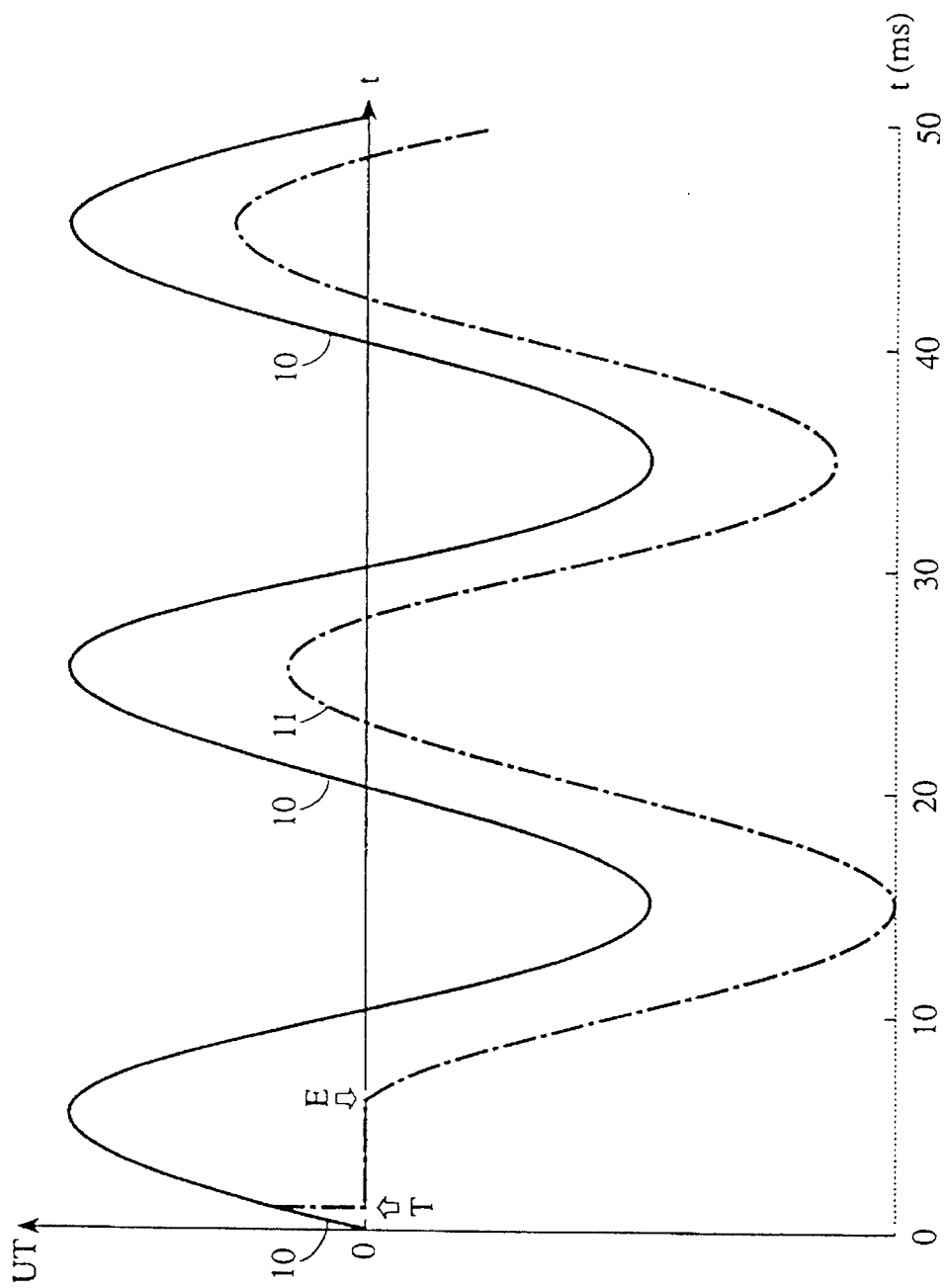

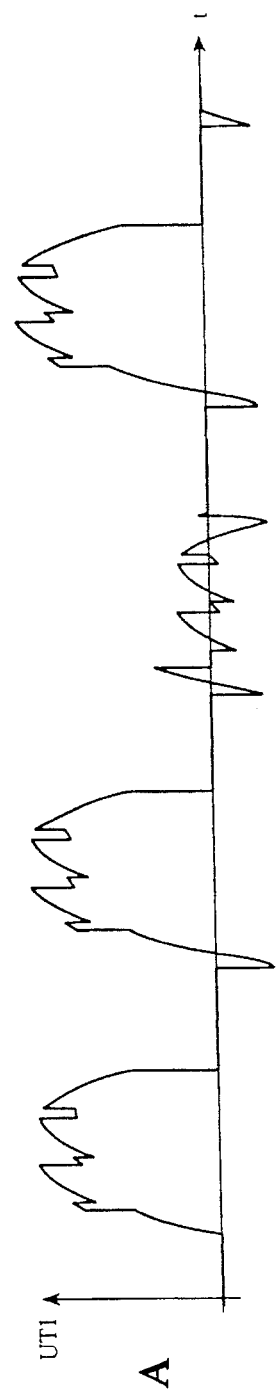
FIG.4A
FIG.4C
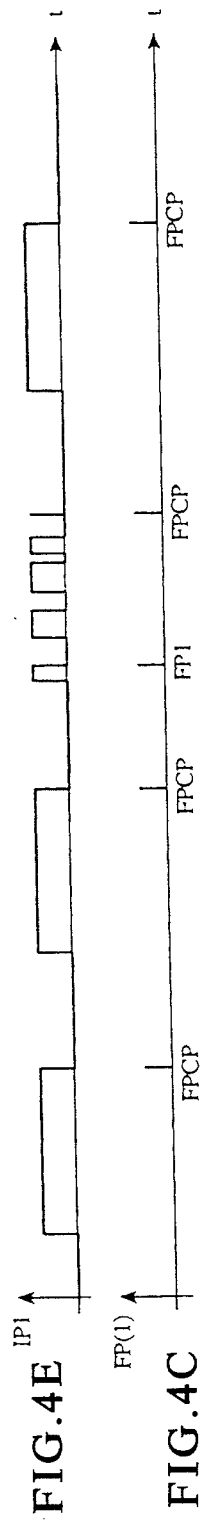
FIG.4E
FIG.4F
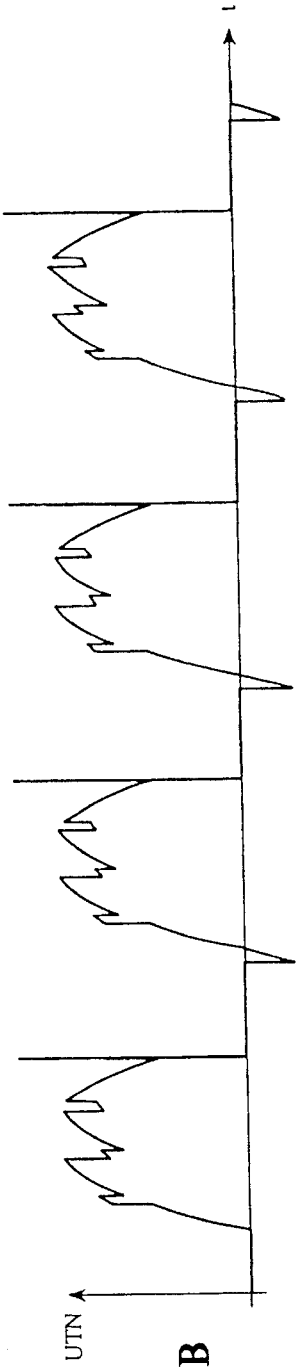
FIG.4B
FIG.4D
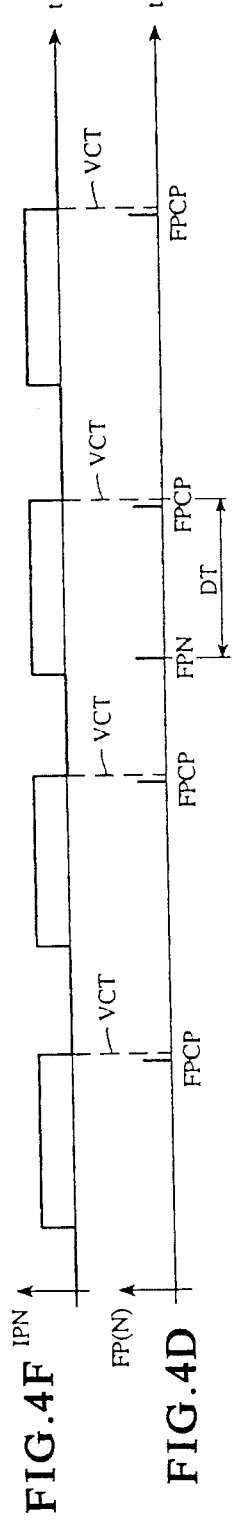

METHOD AND A DEVICE FOR CHECKING THE CONDITION OF SEMICONDUCTOR VALVES

TECHNICAL FIELD

The present invention relates to a method for checking the condition of an optional semiconductor position included in an electric semiconductor valve, for example a valve in a converter for conversion between alternating current and high-voltage direct current, which semiconductor valve comprises a plurality of semiconductor positions with mutually series-connected semiconductor devices, and to a device for carrying out the method.

The device comprises signal-generating members for generating and applying to the firing channel of the semiconductor position alone a test firing signal, a sensing member for timely studying an indicating signal delivered by the indicating channel of the checked semiconductor position, and an evaluation member for determining and indicating the result of the study.

The term "semiconductor position" in this application means a component group comprising a controllable semiconductor device, such as, for example, a thyristor or a gate turn-off thyristor (GTO thyristor), resistors and capacitors, arranged in a conventional manner at the semiconductor device, for voltage protection of the semiconductor device and for voltage division with other semiconductor positions included in the valve, a firing channel for receiving and transmitting firing signals for the semiconductor device, an indicating unit for generating an indicating signal when the voltage across the semiconductor device in its forward direction exceeds a predetermined value, and an indicating channel for delivering the indicating signal.

The term "semiconductor valve", or just "valve", in this application means a set of a plurality of semiconductor positions with mutually series-connected semiconductor devices, which during normal operation electrically function as a unit.

The firing and indicating channels may comprise, in a manner known per se, light guides for non-galvanic signal transmission between different potential levels and may then at their end points comprise members for conversion between electric signals and light signals.

The semiconductor device may be electrically fired or directly light-fired. In the former case, circuits designed in a manner known per se for conversion of a firing signal received in the form of a light signal into an electric signal, adapted to be supplied to the gate of the semiconductor device, may be associated with the indicating unit. In the latter case, the received firing signal may be directly applied to the semiconductor device, via the firing channel, in the form of a light signal. The indicating signal may be of a short type, which means that a short pulse is delivered when the voltage across the semiconductor device passes the predetermined value in an increasing direction, or of a long type, which means that an indicating signal is delivered as long as the voltage exceeds the predetermined value. Long indicating signals may consist of a continuous signal or be in the form of a pulse train.

BACKGROUND ART

An electric valve, for example included in a converter for conversion between alternating current and high-voltage direct current (HVDC converter), comprises a usually large number of mutually series-connected semiconductor devices in the form of thyristors. A control system, located at ground potential, for the converter generates a firing order for the valve and a control system for the valve, also located at ground potential, generates as a result of the received firing order a firing signal for each one of the thyristors included in the valve. These firing signals are received by a firing channel which is associated with each thyristor and which transmits the firing signal to an electronic unit associated with each thyristor. The electronic unit, which is at the potential of the thyristor, comprises, in the case with electrically fired semiconductor devices, circuits for converting a firing signal received as a light signal into an electric firing pulse which is applied to the gate of the thyristor, as well as an indicating unit. Where the thyristots are of a directly light-fired type, the electronic unit consists of an indicating unit only, which is then not connected to the gate of the respective thyristor. The indicating signal generated by the indicating unit is transmitted via an indicating channel to ground potential and is used to ensure, in a manner known per se, that the gate of a thyristor is not supplied with a firing pulse unless its off-state voltage in the forward direction has attained a predetermined value, adapted for a rapid and safe firing, as well as to indicate, by its occurrence, that the respective thyristor is not short-circuited. For the latter purpose, the indicating signal is supplied to a monitoring device for the valve or the converter, whereby the occurrence of an indicating signal also means a confirmation that the respective indicating channel is in operation. The absence of indicating signals for a semiconductor position is recorded in the monitoring device or in some storage medium connected thereto. Both the firing and the indicating channels are usually made as optical fibre links and are provided at their end points with members for conversion between electric and optical signals.

Further, the electronic unit comprises circuits, arranged in a manner known per se, for achieving a voltage-controlled firing of the thyristor in the event that firing in the intended manner by a firing pulse emanating from a firing signal generated by the control system fails to occur. The voltage-controlled firing is initiated when the off-state voltage of the thyristor in the forward direction exceeds a certain level.

For a general description of the technical background within the technical field mentioned, reference is made to Åke Ekström: High Power Electronics HVDC and SVC, EKC—Electric Power Research Center, The Royal Institute of Technology, Stockholm, 1990.

With the valve in the off-state, each thyristor takes up part of the voltage across the valve whereby the voltage division between the individual thyristors is determined by a voltage divider, comprising resistors and capacitors, connected in parallel with the thyristors. The valve is usually so dimensioned that in the event that one or a few individual thyristors, for example because of an internal short circuit, should have no voltage-absorbing ability, the remaining thyristors during operation under normal voltage conditions are still able to block voltages occurring across the valve. However, a monitoring of the operation of the thyristors included in the valve is still necessary such that faulty units can be replaced during planned maintenance work. According to the prior art, the monitoring is carried out in the manner described above by observing the indicating signals transmitted to the monitoring device, whereby the absence of an indicating signal, indicating a fault such as a short circuit in the respective thyristor or a fault in the indicating channel, is recorded together with an indication as to which semiconductor position has been found to lack indicating signal.

However, commonly known systems for the above-mentioned monitoring does not provide any information as to whether the thyristor has been fired in the intended manner by supplying to the gate of the thyristor a firing pulse emanating from a firing signal generated by the control system, or, in the absence of such a firing pulse, by voltage-controlled firing. Thus, a fault in the firing channel for a thyristor cannot be discovered in this way.

SUMMARY OF THE INVENTION

It is an object of the invention to achieve an improved checking of the condition of an optional semiconductor position and thereby particularly to make it possible to check whether its firing takes place by a firing pulse emanating from a firing signal generated by the control system, or by voltage-controlled firing.

According to the invention, this is achieved, with the semiconductor valve energized by an alternating voltage substantially corresponding to the rated voltage thereof, by gene-rating a test firing signal by means of a signal-generating member and applying this signal to the firing channel of the semiconductor position alone at a time when the forward voltage across its semiconductor device is positive, whereupon an indicating signal delivered by the indicating channel of the semiconductor position is studied with respect to time by means of a sensing member, and, in dependence on the result of this study, it is determined by means of an evaluating member whether the function of the semiconductor position is correct.

Advantageous improvements of the invention will be clear from the following description and the appended claims.

BRIEF DESCRIPTION OF THE DRAWINGS

The invention will be explained in greater detail by describing embodiments with reference to the accompanying drawings, wherein FIG. 3 shows variations of thyristor voltage as well as firing pulses and indicating signals in one embodiment of the invention, FIG. 4A–4F show variations of thyristor voltage as well as firing pulses and indicating signals in another embodiment of the invention.

DESCRIPTION OF THE PREFERRED EMBODIMENTS

The following description relates to the method as well as to the device.

Figure 1A:
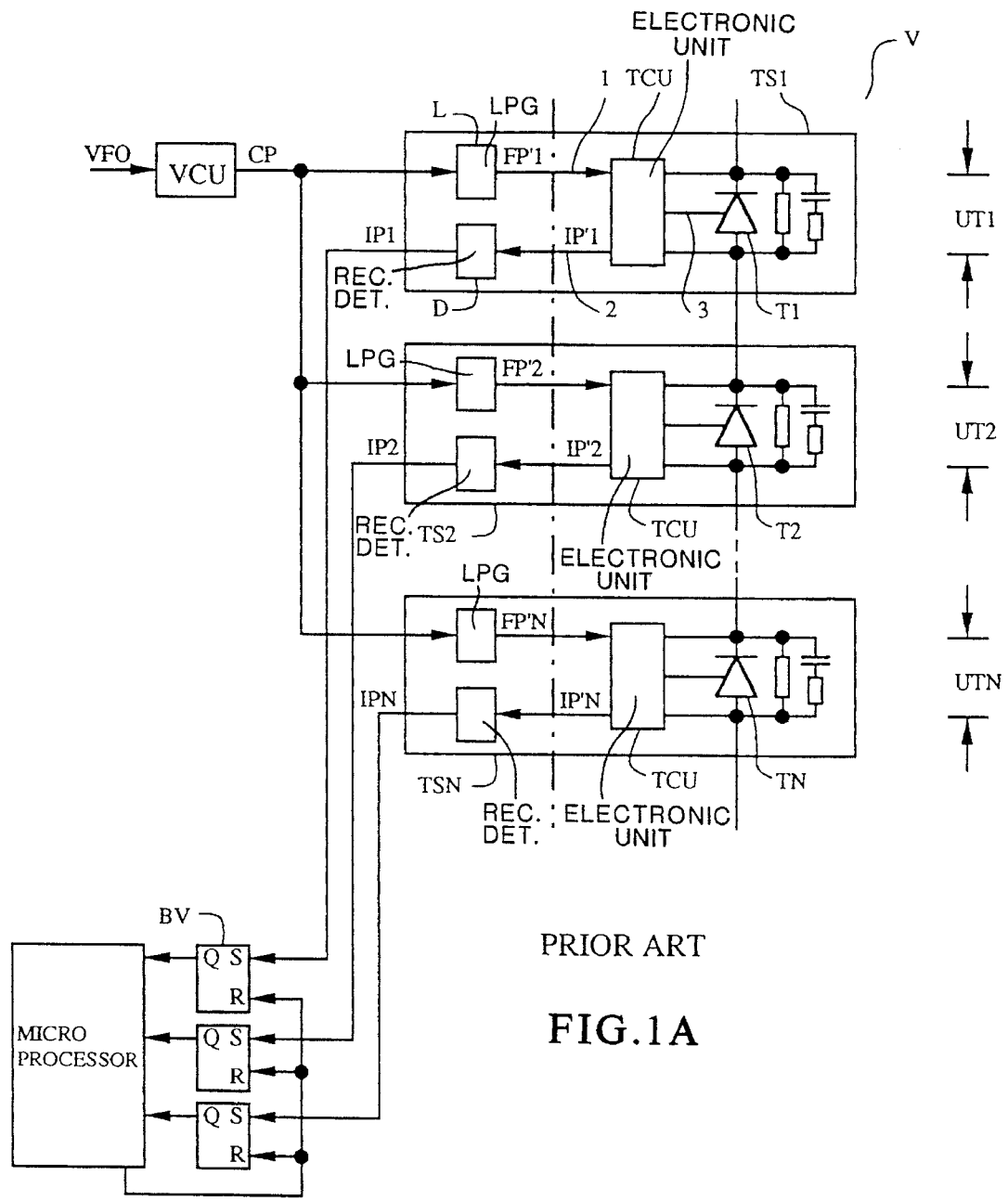
FIG. 1A shows in the form of a block diagram a known device for monitoring of semiconductor positions in an HVDC converter.

FIG. 1A shows part of a valve V in an HVDC converter. The valve comprises N mutually series-connected thyristors T1, T2, ... TN with electric firing, of which only three are shown in the figure. Associated with each thyristor is an electronic unit TCU, which is thus placed at a high potential. In the figure, a dash-dotted line marks a dividing line such that parts shown to the right of this line are at high potential and parts located to the left of this line are at ground potential. Associated with each electronic unit is a light-pulse generator L, connected to the respective electronic unit by means of a first light guide 1, and a receiving detector D, connected to the respective electronic unit by means of a second light guide 2. The light-pulse generators can all be activated simultaneously by a firing signal CP, generated by a valve control system VCU, which in turn is activated by a firing order VFO for the valve, generated by a control system (not shown) for the converter. When a light-pulse generator is activated, a firing signal FP'1, FP'2, ... FP'N is sent therefrom to the electronic unit of the respective thyristor, in which the firing signal is converted into an electric signal which via a conductor 3 is applied to the gate of the thyristor to cause the thyristor to carry current. Each one of the electronic units also comprises an indicating unit of the previously mentioned kind and from these indicating units indicating signals IP'1, IP'2, ... IP'N in the form of light signals are emitted via the light guides 2 to the respective receiving detector D, in which the received light signal is converted into a corresponding electric signal.

Figure 1B:
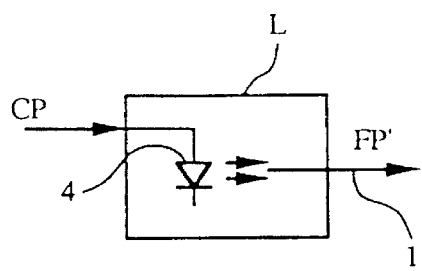
FIGS. 1B–1D show embodiments of certain blocks shown in FIG. 1A.
Figure 1C:
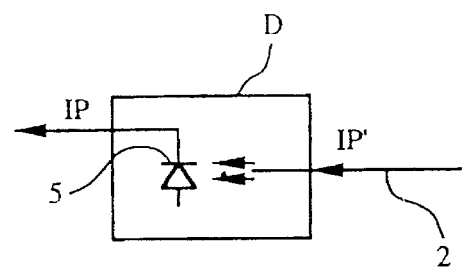
Figure 1D:
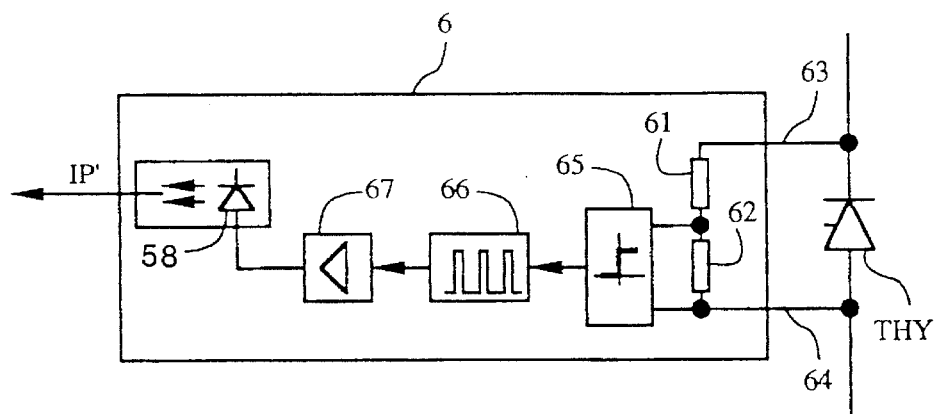

FIG. 1B shows an embodiment of a light-pulse generator L, comprising a light-emitting diode 4, FIG. 1C shows an embodiment of a detector D comprising a light-sensitive diode 5, and FIG. 1D shows an embodiment of an indicating unit 6, comprising a resistive voltage divider 61, 62 which, by means of conductors 63, 64, is primarily connected over the thyristor and secondarily to the input of a level-sensing member 65, an oscillator 66, which is activated by the level-sensing member, an amplifying member 67, which receives the output signal of the oscillator and, after adaptation of the signal level, applies its output signal to a light-emitting diode 58. The oscillator 66 generates a pulse train where the pulses may, for example, have a duration of 1 µs and the gap between two consecutive pulses have a length of, for example, 5 µs.

Each one of the light-pulse generators L with the associated first light guide 1, the circuits arranged in the respective electronic unit for conversion of the firing signal into an electric signal, and the guide 3 between the outputs of these circuits and the gate of the thyristor thus form a firing channel. Each one of the indicating units including their conductors 63, 64 for connection across the thyristor as well as the associated second light guide 2 and detector D form an indicating channel.

A firing channel, the associated thyristor with resistors and capacitors for voltage protection of the semiconductor device and for voltage division with other semiconductor devices as well as the associated indicating channel form a semiconductor position TS.

In a manner known per se, but not shown here, the output signals from the detectors D are used to ensure that firing does not take place until a sufficient voltage across the thyristor has been achieved. The indicating signals arriving are also each supplied to a respective bistable flip-flop BV, monitored by a microprocessor common to these flip-flops. At the beginning of each positive half-period for the alternating voltage applied across the valve, there is thus obtained an indicating signal IP from each indicating unit, except from those which are connected to a short-circuited thyristor or where there is no signal because of a fault in the indicating channel—here is no possibility of distinguishing these cases from each other. Nor is it possible to determine, in those cases where an indicating signal is delivered, whether the firing takes place because of a firing signal emanating from the control system of the valve or by voltage-controlled firing.

To accomplish a more complete possibility of carrying out a check of the condition of an individual semiconductor position, it is foreseen according to the invention that an emission of individual firing signals is made possible in such a way that a special test firing signal can be emitted to a single one of the semiconductor positions whereas the other ones do not receive such a test firing signal.

Figure 2:
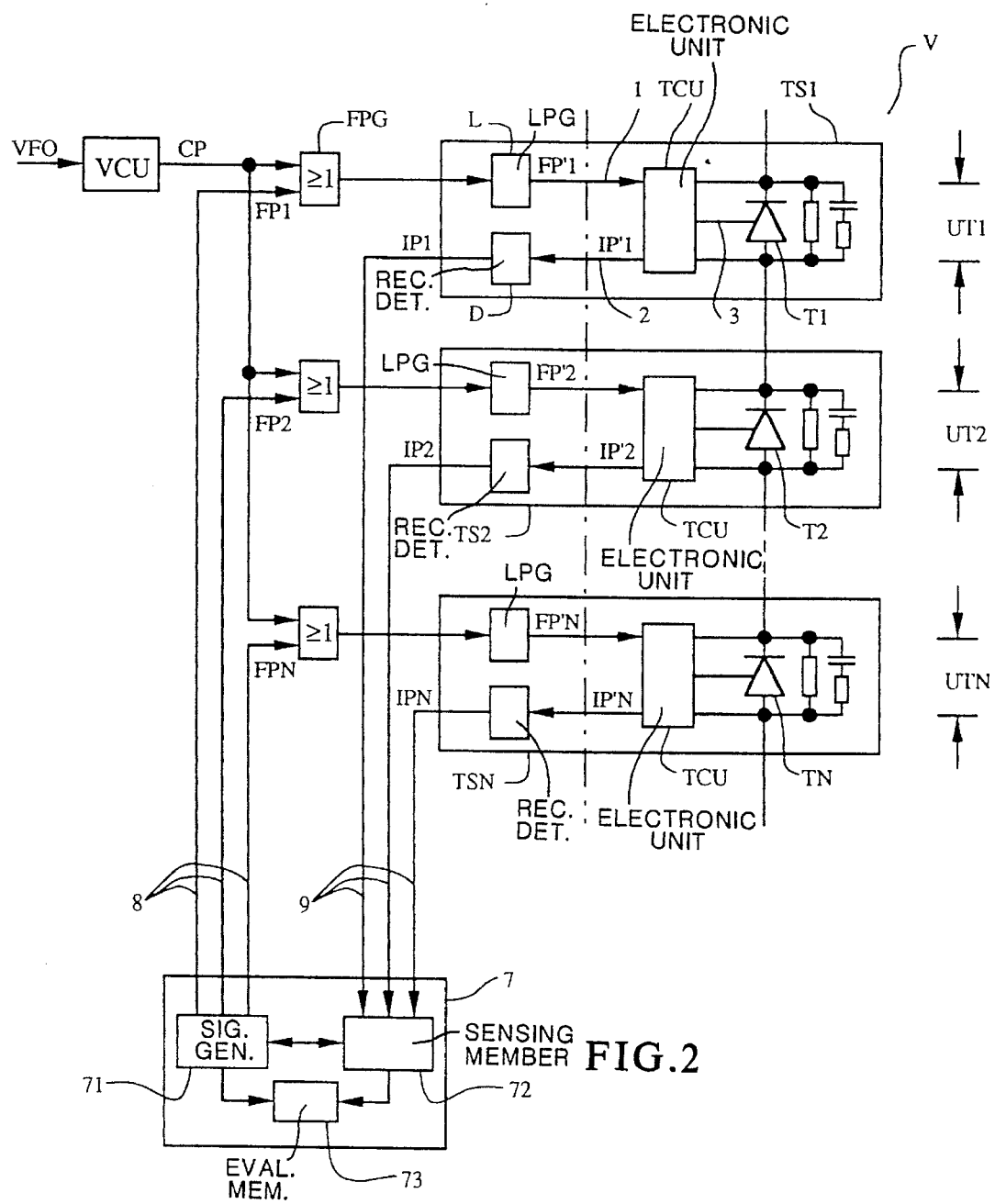
FIG. 2 shows in the form of a block diagram an embodiment of the invention.

An example of such a possibility is shown in FIG. 2, where a device 7 for checking the condition according to the invention is shown. The device 7 comprises a signal-generating member 71 for generating and applying to the firing channel of an optional semiconductor position TS1, TS2, . . . TSN alone a test firing signal FP1, FP2, . . . FPN, a sensing member 72 for timely studying an indicating signal IP1, IP2, . . . IPN delivered by the indicating channel of the checked semiconductor position, and an evaluation member 73 for determining and indicating the result of the study. Associated with each semiconductor position is a signal-selector gate FPG, the output of which is connected to the light-pulse generator of the position and one input of which receives the firing signal CP, generated by the valve control system vCU, and the other input of which receives one of the individual test firing signals FP1, FP2, . . . FPN generated by the signal-generating member. The test firing signals are each transmitted to the signal selector gates via a respective conductor 8. The light-pulse generators can thus receive firing signals emanating both from the control system of the valve and from the device 7 for checking the condition. The indicating signals IP1, IP2, . . . IPN delivered by the detectors D are each supplied to the sensing member 72 included in the device 7 via a respective conductor 9.

In an embodiment according to the invention, which is suitably carried out when alternating voltage is applied to the valve, preferably substantially corresponding to the rated voltage of the valve, but when otherwise the valve is not in operation, the various semiconductor positions are tested one-by-one by sending thereto, by means of the signal-generating member, a test firing signal from the device 7 via the conductors 8 and the signal selector gates FPG. This is carried out at a time when forward voltage is applied to the thyristors, and preferably close to a angle of 90° for the alternating voltage. To reduce the voltage stresses on the thyristors, the angle is suitably chosen larger than 90°. During the testing, none of the energized semiconductor positions receives firing signals CP emanating from the valve control system VCU.

Thereafter, the time of the arrival of the following indicating signals for the other semiconductor positions is studied and compared with the indicating signal which arrives from the semiconductor position which has received a test firing signal. When the condition is correct, the indicating signal of the tested semiconductor position shall then be delayed in relation to the other ones. If this is not the case, there is a fault—no firing has taken place by means of the test firing signal. If it is known, for example by a monitoring during operation according to the technique described with reference to FIG. 1A, that normal indicating signals arrive from the tested semiconductor position under normal operating conditions, and that thus the thyristor itself is functioning, the conclusion can be drawn that the thyristor in this unit is regularly fired by means of voltage-controlled firing. A fault is thus present in the firing channel of the semiconductor position and should suitably be corrected.

It is suitable also to carol out a further testing in such a way that the power of the light signals for firing under the same circumstances is reduced, for example by 30–50%. In the same way it is determined if, as it should, a delayed indicating signal is obtained. If this is not the case, the safety factor for the firing channel is insufficient, either in the electronic unit or in the light-pulse generator L.

Figure 5A:
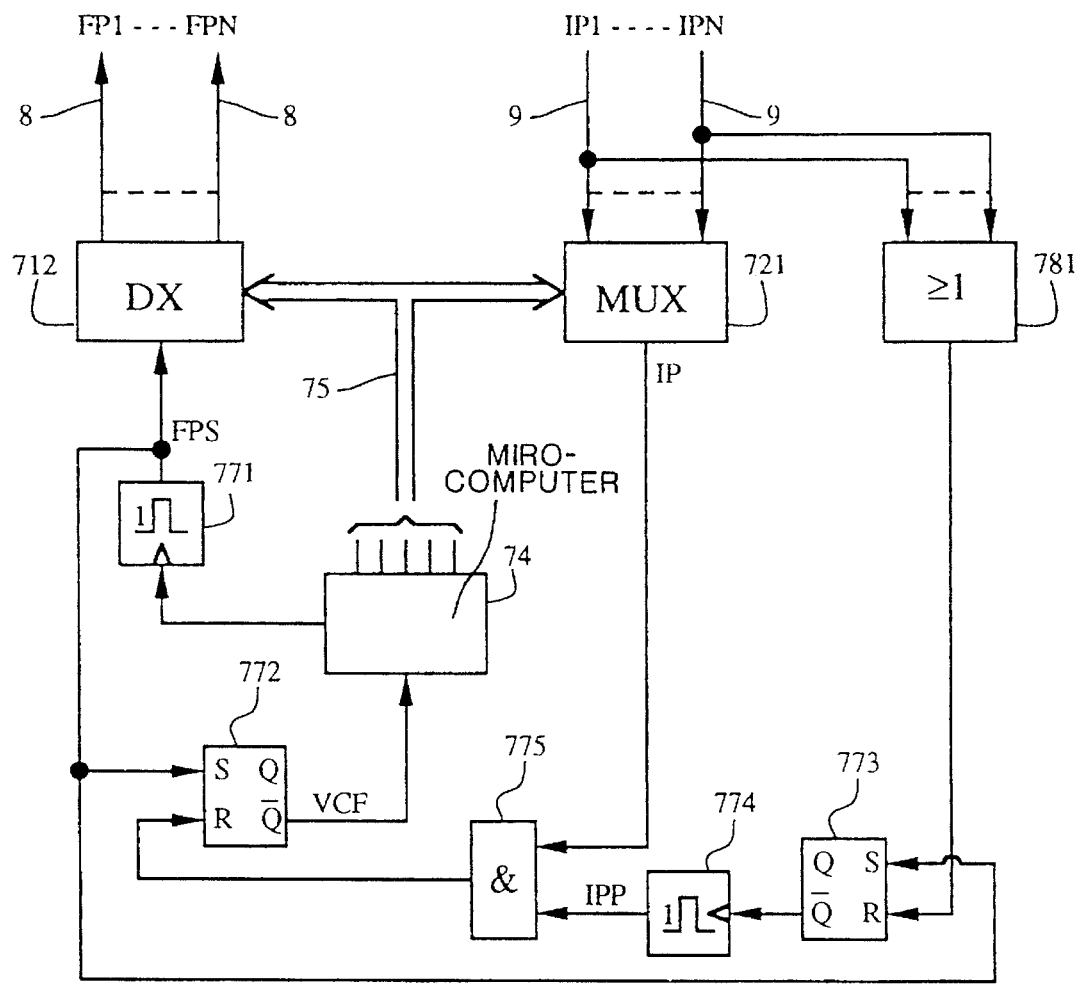
FIG. 5A shows in the form of a block diagram an embodiment of a device for checking the condition according to the invention, FIG. 5B schematically shows a 6-pulse valve bridge included in an HVDC converter.

FIG. 5A shows in more detail the embodiment of the device for checking the condition of a valve V. The checking device comprises a demultiplexor 712 and a multiplexor 721, with a number of outputs and inputs, respectively, which correspond to the number of semiconductor positions in the valve, whereby each semiconductor position is associated with an output on the demultiplexor and an input on the multiplexor. Each one of the outputs of the demultiplexor is connected, via a respective conductor 8, to a signal selector gate FPG and each one of the inputs of the multiplexor receives, via conductors 9, indicating signals from the respective semiconductor position, as described with reference to FIG. 2. A microcomputer 74 transmits via a signal bus 75, in a manner known per se, address information relating to a semiconductor position in the valve and influences the demultiplexor and the multiplexor such that the indicating signal IP for the addressed semiconductor position appears on the output of the multiplexor and such that a signal FPS on the input of the demultiplexor is supplied via its output to the signal selector gate which is connected to the firing channel of the addressed position. When a test firing signal is to be emitted, the input of a monostable flip-flop 771 is activated by means of the microcomputer, which flip-flop, when a signal is supplied to the input thereof, delivers a signal in the form of a short pulse FPS, for example of the duration 1 µs, which is supplied to the input of the demultiplexor and is forwarded therefrom as a test firing signal for the addressed semiconductor position. The signal FPS is also supplied to the S-inputs of a bistable flip-flop 772 and of a bistable flip-flop 773, the inverted Q-outputs of these flip-flops then assuming the value "0". The indicating signals IP1, IP2, . . . IPN from the semiconductor positions of the valve are supplied to an OR circuit the output of which is connected to the R-input of the bistable flip-flop 773. When at least one of the above-mentioned indicating signals is delivered by the respective indicating channel, the output of the OR circuit and hence also the inverted Q-output of the bistable flip-flop 773 assume the value "1".

The inverted Q-output is connected to a monostable flip-flop 774 which, when a signal is supplied to the input thereof, delivers a signal in the form of a short pulse IPP, which is supplied to a first input of an AND circuit 775. The indicating signal IP from the addressed semiconductor position appears on the output of the multiplexor and is supplied to a second input of the AND circuit. In the event that the indicating signal IP of the addressed semiconductor position is delivered during the time during which the first input of the AND circuit receives a "1" signal, the AND circuit delivers a "1" signal to the R-input of the bistable flip-flop 772 and sets the inverted Q-output thereof at the value "1". This signal constitutes a fault signal VCF, which is supplied to the microcomputer.

In the event that the indicating signal IP of the addressed semiconductor position in relation to the indicating signals from the other semiconductor positions is delivered delayed by a time exceeding the length of the pulse IPP, the output of the AND circuit remains "0" and the inverted Q-output of the bistable flip-flop does not deliver any fault signal.

By a suitable choice of the length of the pulse IPP, it can be concluded from the occurrence of the fault signal VCF that firing of the semiconductor device in the addressed semiconductor position has not taken place by means of the test firing signal FP but that firing during normal operation takes place by voltage-controlled firing. An advantageous choice of the length of the pulse IPP is, for example, 1 ms.

The fault signal VCF and information about the address of the corresponding semiconductor position are recorded in a manner known per se in the microcomputer for storage and retrieval of information about the defective semiconductor position.

An explanation why the invention according to this embodiment is able to function resides in how resistors and capacitors for voltage protection of the semiconductor device and for voltage division cooperate with the respective thyristor. It would go too far to go into all the details of these very complicated circuits, but to acquaint oneself with the invention it is sufficient to refer to the schematic FIG. 1E. Parallel to the series-connected thyristors in a valve, a voltage divider is arranged which comprises voltage divider resistors R1 connected in parallel across each thyristor. Further, a series circuit is arranged parallel to each thyristor, which series circuit comprises a capacitor C2 connected in series with a resistor R2. Typical values of the components included are R1=40 kohms, C2=3 microfarads, and R2=40 ohms.

In FIG. 3 the upper curve shows the voltage UT across a single one of the thyristors as a function of time in case no firing takes place. Each time the voltage in the forward voltage direction exceeds a threshold value, which may be 30–100 V, an indicating signal is delivered, here designated 10.

Figure 1E:
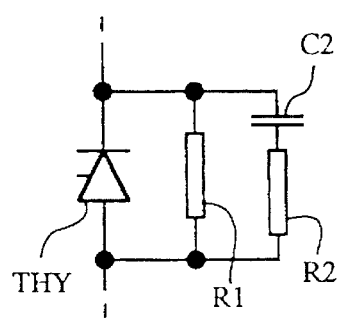
FIG. 1E shows a schematic equivalence circuit for a thyristor with associated RC circuits.

The lower curve in FIG. 3 shows the voltage across one single thyristor in case this is fired at the time T. Across the thyristor there is then applied a voltage which depends on the time of firing and which immediately drops to zero by the thyristor becoming conducting at the time of firing, whereby the capacitor C2 is discharged through the thyristor while at the same time the thyristor short-circuits the resistor R1. At a certain time E the current through the thyristor becomes so low that the thyristor stops conducting. The voltage across the thyristor and hence across the other components shown in FIG. 1E is then essentially zero. The voltage then drops, as shown in FIG. 3, and then again rises with the alternating voltage but lags behind, so to speak, in relation to the voltage across the other thyristors in the valve. Therefore, the indicating signal at the time 11 according to FIG. 3 will be delayed in relation to the time 10 for the others, which have not had their capacitors C2 discharged. After a few periods of the alternating voltage, also the capacitor C2 of the tested semiconductor position will have recovered. The delay will thus remain, which does not prevent testing other semiconductor positions before full recovery has been made, provided that the fact that the indicating signals of newly tested semiconductor positions are not representative is taken into consideration. The above explanation is relatively lucid and the intention is not that it should be a limiting factor for the invention, which is based on the observation of the actual delay between indicating signals at the time 10 and the time 11, when only the thyristor of one semiconductor position has been made conducting.

In another embodiment according to the invention, which is suitably carried out when the valve is in normal operation and the indicating units generate indicating signals of a long type, the various semiconductor positions are tested one-by-one by sending thereto a test firing signal from the signal-generating member 71 via the conductors 8 and the signal selector gates FPG in the way described with reference to the preceding embodiment. This is carried out at a time when forward voltage is applied to the respective thyristor but before the time when the semiconductor position receives a firing signal CP from the valve control system VCU which is in operation. During the testing, only one semiconductor position at a time receives a test firing signal.

Thereafter, the time when the indicating signal from the tested semiconductor position disappears is studied and compared with the time for emission of the test firing signal. In case of correct condition, the indicating signal of the tested semiconductor position shall then disappear after a delay $\Delta T_{min}$ corresponding to the sum of the time lags in the firing and indicating channels as well as the changeover time of the thyristor from off-state to on-state. If this is not the case but an additional delay can be observed before the indicating signal disappears, the conclusion can be drawn that the thyristor fires in a voltage-controlled manner. A fault is thus present in the firing channel of the semiconductor position and should be corrected in a suitable way.

The method is illustrated in FIGS. 4A–4F, which for two semiconductor positions TS1 and TSN in a valve shows the voltages UT1 (FIG. 4A) and UTN (FIG. 4B) across the respective thyristor as a function of time, as well as the positions in time for the firing signals FP(1) (FIG. 4C) and FP(N) (FIG. 4D) and the indicating signals IP1 (FIG. 4E) and (FIG. 4F) IPN of the respective semiconductor positions. The firing signals FP(1), FP(N) may emanate from the valve control system or from the checking device. Firing signals emanating from the control system of the valve which is in normal operation are designated FPCP and the test firing signals which are emitted from the checking device are designated FP1 and FPN, respectively. The figure illustrates the fact that the semiconductor position TS1 operates correctly whereas the semiconductor position TSN does not operate correctly. When the respective thyristor is fired in case of positive forward voltage, the voltage across the thyristor breaks down into a value near zero whereby the corresponding indicating signal disappears. The thyristor T1 is fired, when its condition is not checked according to the invention, by means of firing signals emanating from the control system of the valve and its indicating signal IP1 disappears, when a firing signal has been applied, after the above-mentioned delay $\Delta T_{min}$. For the thyristor T1 this also applies to the case where the applied firing signal consists of the test firing signal FP1. The thyristor T2 is fired by voltage-controlled firing by means of firing signals, which are initiated by the above-mentioned circuits for voltage-controlled firing which are included in the electronic unit and which are later in time than the firing signals FPCP. The positions with respect to time for the voltage-controlled firing are designated VCT in the figure. Nor does the test firing signal FPN achieve firing of the thyristor TN so the forward voltage across this thyristor remains until the voltage-controlled firing occurs. This fact manifests itself by the indicating signal IPN disappearing only after a time $DT > \Delta T_{min}$ after the emission of the test firing signal FPN.

Figure 5B:
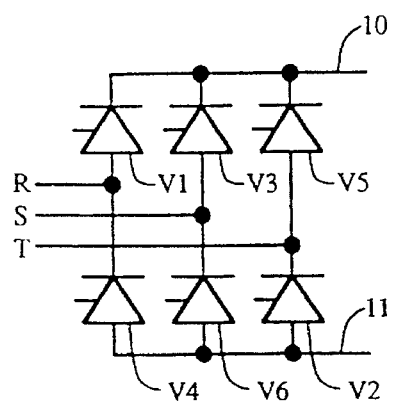
FIG. 5C shows in the form of a block diagram another embodiment of a device for checking the condition according to the invention.
Figure 5C:
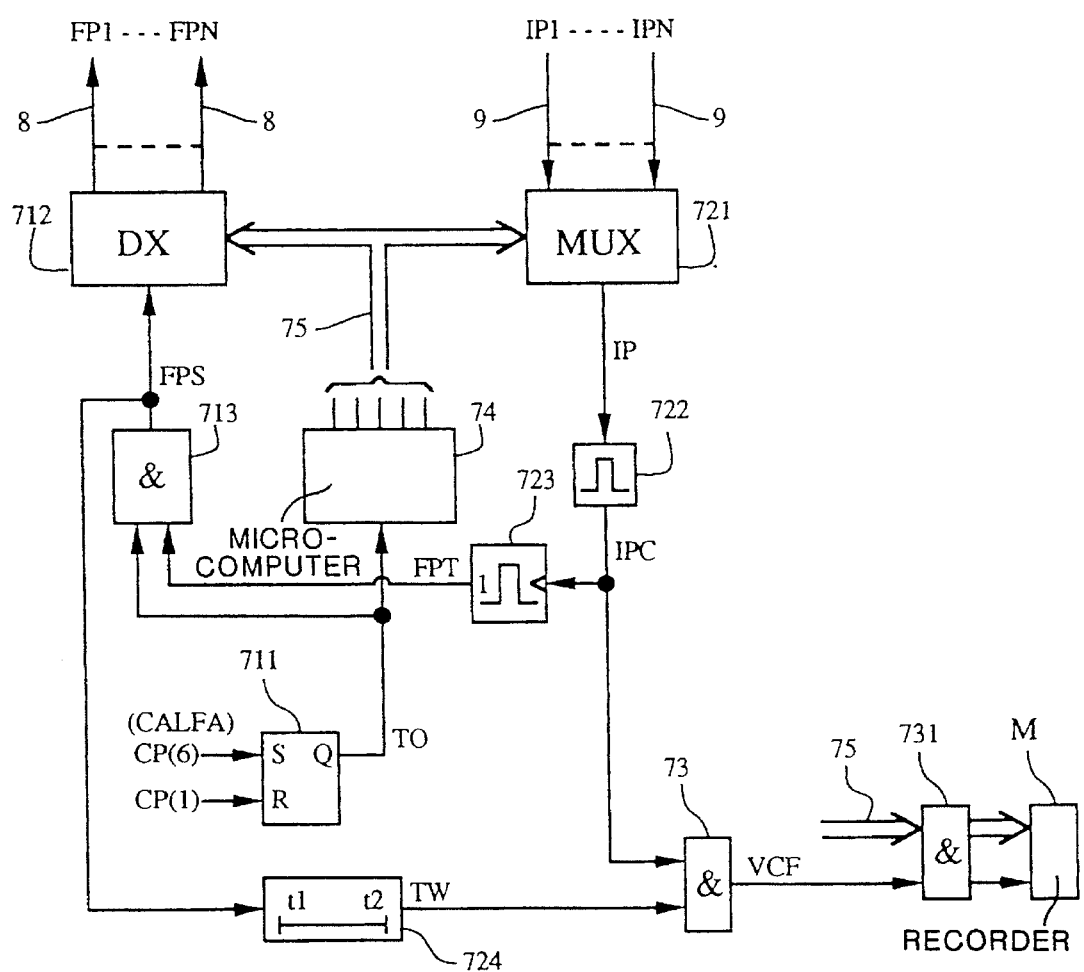

FIGS. 5B and 5C illustrate an embodiment of the device 7 for checking the condition, which is advantageous when the semiconductor valve is included in a converter in a bridge connection. FIG. 5B shows a converter in a three-phase 6-pulse bridge connection comprising six valves V1, V2, . . . V6. The bridge is connected, in a manner known per se, between a three-phase a.c. network, in the figure only designated R, S, T, and a d.c. network, in the figure only denoted by two conductors 10, 11. In a manner described with reference to FIG. 2, each one of the valves receives a firing signal (CP(1), CP(2), . . . CP(6) which is common to the respective valve and is generated by a valve control system associated with the valve. A firing order VFO is generated in a manner known per se by a control system for the converter such that the valves are cyclically supplied with a firing order VFO in the sequence V1, V2, . . . V6, V1 . . . . Each one of the valves comprises N semiconductor positions which, as described with reference to FIG. 2, via signal selector gates FPG, can receive the firing signal CP, which is common to the valve, as well as individual test firing signals FP. Each one of the semiconductor positions delivers an indicating signal IP of a long type via an indicating channel.

FIG. 5C shows in more detail the embodiment of the device for checking the condition of the valve VI. The checking device comprises a demultiplexor 712 and a multiplexor 721, with a number of outputs and inputs, respectively, which correspond to the number of semiconductor positions in the valve, whereby each semiconductor position is associated with an output on the demultiplexor and an input on the multiplexor. Each one of the outputs of the demultiplexor is connected, via a respective conductor 8, to a signal selector gate FPG and each one of the inputs of the multiplexor receives, via conductors 9, indicating signals from the respective semiconductor position, as described with reference to FIG. 2. A bistable flip-flop 711 is supplied on its S-input with the firing signal CP(6), for the valve V6, which lies before the valve V1 in the commutating sequence, and on its R-input with the firing signal CP(1) for the valve V1. The signal CP(6) sets the Q-output of the bistable flip-flop, the output signal of which is designated TO, at "1", which activates a counter 74. When the valve V1 takes up off-state voltage in the forward direction, indicating signals in the form of pulse trains are received, as described above with reference to FIG. 1D. The counter 74 transmits via a signal bus 75, in a manner known per se, address information relating to a semiconductor position in the valve and influences the demultiplexor and the multiplexor such that the indicating signal IP for the addressed semiconductor position appears on the output of the multiplexor and such that a signal FPS on the input of the demultiplexor is supplied via its output to the signal selector gate which is connected to the firing channel of the addressed position. A monostable flip-flop 722 which, when a signal is supplied to its input, on its output delivers a pulse the pulse length of which exceeds the gap between two consecutive pulses in the indicating signal, in this case for example 10 μs, converts the indicating signal into a continuous indicating signal IPC. The continuous indicating signal ICP is supplied to a monostable flip-flop 723 which, when a signal is supplied to its input, delivers a short pulse FPT, for example of a length of 1 μs, to the input of an AND gate 713. This takes place when the indicating signal IP and hence the continuous signal IPC appear. The second input of the AND gate is supplied with the signal TO from the Q-output of the bistable flip-flop 711, and since this has already assumed a "1" state, a signal FPS is generated on the output of the AND gate 713 when the indicating signal IP appears, which signal FPS is supplied to the input of the demultiplexor and is forwarded therefrom as a test firing signal for the addressed semiconductor position. The signal FPS is also supplied to a time-lag circuit 724, the output of which reproduces the input signal with a delay t1 when a signal is supplied to the input thereof and a delay t2 when the signal disappears. The output signal TW from the time-lag circuit and the output signal from the flip-flop 722 are supplied to an AND gate 73, whereby the signal TW can be said to provide a time window for study of the indicating signal IPC converted into continuous state. In case the indicating signal IPC is still present within this time window, the AND gate 73 delivers on its output a fault signal VCF. By a suitable choice of this time window, that is, of the delay t1 and the delay t2 for the time-lag circuit 724, the conclusion can be drawn from the occurrence of the fault signal VCF that firing of the semiconductor device in the addressed semiconductor position has not taken place by means of the test firing signal FP but that firing has taken place by voltage-controlled firing. An advantageous choice of the times t1 and t2 can, in this example, be t1=20 μs and t2=30 μs.

The fault signal VCF and information about the address of the corresponding semiconductor position are supplied to a recording device M of a kind known per se, for example a memory associated with a microcomputer, for storage and retrieval of information about the defective semiconductor position. Recordation of information as to which semiconductor position has been found to have a faulty condition is carried out in a manner known per se, and schematically indicated in FIG. 5C, by supplying address information from the signal bus 75 via an AND gate 731 to the recording device M when the fault signal VCF is present.

When the firing signal CP(1) for the tested valve V1, generated by the valve control system, is supplied to the R-input of the bistable first flip-flop 711, the output signal TO from the Q-output thereof assumes the value "0", which deactivates the counter 72 and blocks the first AND gate 13. Before the next firing of the valve V1, the output signal TO on the Q-output of the bistable first flip-flop 711 is again set at "1" by the firing signal CP(6) for the valve V6, whereby the counter 72 steps one step to influence the demultiplexor and the multiplexor via the bus 75 such that the signals FPS on the input of the demultiplexor and IP on the output of the multiplexor, respectively, are connected to the semiconductor position in the valve which is next to be checked, for example a valve directly series-connected to the valve of the preceding check. Semiconductor positions, the semiconductor devices of which are permanently short-circuited or the indicating channels of which are defective, do not deliver any indicating signal and will not therefore, when addressed by the checking device, be supplied with any test firing signal.

Checking devices corresponding to the one described with reference to FIG. 5C are arranged for each of the valves, the S-input of the first flip-flop 711 being supplied with the valve firing signal CP(n-1) and the R-input of the flip-flop being supplied with the valve firing signal CP(n), where index n refers to the valve which is to be checked and index n-1 refers to the valve which immediately precedes the former valve in the commutating sequence. The recording device M can, of course, be common to one or more valves and/or converters and furthermore be adapted to record, in addition to an address identification for the semiconductor position, also an identification of the respective valve and/or converter.

The device shown in FIG. 5C can also be used for a valve which is not part of a bridge connection. In that case, the S-input of the bistable first flip-flop 711, instead of being supplied with the firing signal CP(6), as is the case with the bridge connection, is supplied with a signal CALFA for setting the Q-input of the flip-flop at "1" This is marked in FIG. 5C by CALFA within parenthesis at the S-input of the flip-flop 711. In this case it is advantageous to supply the signal CALFA at an electrical angle which, counting from the rising zero crossing of the alternating voltage, is smaller than the minimum control angle of the semiconductor valve during normal operation, for example 10°.

The checking devices shown may in applicable parts, wholly or partially, consist of, for example, a microcomputer, programmed according to the principles which are clear from the above description, or of hard-wired circuits provided for the particular purpose.

As long as the firing via the firing channel is operating, the system has a redundancy such that drop-out of a firing channel permits a protective function with voltage-controlled firing to take over. If the firing via the firing channel drops out, this redundancy is no longer present. If both of the mentioned methods for firing drop out, the thyristor will break down and become permanently short-circuited.

By the invention it is possible to carry out an automatic check of all of the semiconductor positions included in the valve. It is often a question of very large plants with a large number of positions. In each valve the number of thyristors may be up to 250, and in a 12-pulse system the number of units to be tested can thereby amount to the order of magnitude of 3,000 units. The alternative of carrying out a manual measurement check of all the positions, which would otherwise be necessary, is therefore a very extensive operation, which can be essentially eliminated by the invention. Only those positions which have been diagnosed according to the invention thus need to be overhauled manually, usually for replacing the entire electronic unit for a semiconductor position.

The invention has been exemplified by a valve where the actual semiconductor devices consist of thyristors with electric firing. It is to be foreseen that the development of directly light-fired thyristors and of gate turn-off thyristors, so-called GTO thyristors, will be such that also thyristors of these kinds will be used in corresponding applications, and it should therefore be pointed out that the invention can also be applied to checking of the condition of semiconductor positions comprising these types of semiconductor devices.

The invention can, of course, be applied also to semiconductor valves intended for other purposes than conversion between alternating current and direct current.

We claim:

1. A method for checking the condition of an optional semiconductor position included in an electric semiconductor valve and comprising a plurality of semiconductor positions with mutually series-connected semiconductor devices, comprising the steps of:

energizing the electric semiconductor valve by an alternating voltage substantially corresponding to the rated voltage thereof;

generating a test firing signal and supplying said firing signal to a firing channel only of the semiconductor position at a time when the forward voltage across the semiconductor device of the semiconductor position is positive; and checking that an indicating signal, supplied by an indicating channel of the semiconductor position, which immediately exceeds the supplied test firing signal, is delayed relative to indicating signals from the other semiconductor positions included in the electric semiconductor valve, whereby a failing delay indicates an incorrect condition of the checked semiconductor position.

2. A method according to claim 1, further comprising the step of supplying the test firing signal at an electrical angle greater than 90 degrees as determined from the rising zero crossing of the alternating voltage.

3. A method according to claim 1, further comprising the step of supplying the test firing signal with reduced power.

4. A method for checking the condition of an optional semiconductor position included in an electric semiconductor valve, said electric semiconductor valve comprising a plurality of semiconductor positions with mutually series-connected semiconductor devices, comprising the steps of:

energizing the electric semiconductor valve by an alternating voltage substantially corresponding to the rated voltage thereof;

generating a test firing signal and supplying said test firing signal to the firing channel only of the semiconductor position when a firing channel of the semiconductor position is supplied with firing signals generated by a valve control system for control of the electric semiconductor valve during normal operation and at a time when the forward voltage across the semiconductor device of the semiconductor position is positive and which is earlier than the firing signal supplied by the valve control system during the same period of the alternating voltage; and checking that the time for disappearance of an indicating signal supplied by an indicating channel of the semiconductor position is not delayed in relation to the time of application of the test firing signal, whereby a delay exceeding a given time indicates a faulty condition of the checked semiconductor position.

5. A method according to claim 4, comprising the step of checking whether the indicating signal is present during a time interval which begins after a given first time after the application of the test firing signal and ends at a given second time thereafter.

6. A method according to claim 4, comprising the steps of supplying the test firing signal at an electrical angle smaller than a minimum control angle of the electric semiconductor valve, as determined from the rising zero crossing of the alternating voltage.

7. A method according to claim 4, comprising the step of supplying the test firing signal when an indicating signal is delivered by the indicating channel of the checked semiconductor position.

8. A method according to claim 4, wherein the electric semiconductor valve is included in a converter in a bridge connection, and further comprising the step of supplying the test firing signal to semiconductor positions selected in dependence on firing signals generated by the vale control system of the converter for control of the electric semiconductor valve during normal operation.

9. A method according to claim 4, further comprising the step of supplying the test firing signal only when an indicating signal has been delivered by the indicating channel of the checked semiconductor position.

10. A method according to claim 4, further comprising the step of supplying the test firing signal with reduced power.

11. A device for checking the condition of an optional semiconductor position included in an electric semiconductor valve, said electric semiconductor valve comprising a plurality of semiconductor positions with mutually series-connected semiconductor devices, said device comprising:

a signal-generating member which generates and supplies to a firing channel only of the semiconductor position a test firing signal;

a sensing member which determines whether an indicating signal delivered by an indicating channel of the checked semiconductor position is delayed relative to indicating signals from the other semiconductor positions included in the electric semiconductor valve; and an evaluating member which delivers a fault signal if there is no delay.

12. A device for checking the condition of an optional semiconductor position included in an electric semiconductor valve, said electric semiconductor valve comprising a plurality of semiconductor positions with mutually series-connected semiconductor devices, said device comprising:

a signal-generating member which generates and supplies to a firing channel of the semiconductor position alone a test firing signal;

a sensing member which determines if an indicating signal delivered by an indicating channel of the checked semiconductor position terminates within a given time after the application of the test firing pulse; and an evaluating member which delivers a fault signal if the indicating signal terminates later than said given time after the application of the test firing pulse.

13. A device according to claim 12, wherein the sensing member comprises an internal-generating member which generates a time interval which begins after a given first time after the application of the test firing signal and ends at a given second time thereafter.

14. A device according to claim 12, wherein the signal-generating member supplies the test firing signal at an electrical angle smaller than a minimum control angle of the electric semiconductor valve, as determined from the rising zero crossing of the alternating voltage.

15. A device according to claim 12, wherein the signal-generating member supplies the test firing signal when an indicating signal is delivered by the indicating channel of the checked semiconductor position.

16. A device according to claim 12, wherein the electric semiconductor valve is included in a converter in a bridge connection, further comprising a selector member which selects the checked semiconductor position in dependence on firing signals generated by a valve control system of the converter for control of the electric semiconductor valve during normal operation.

17. A device according to claim 12, wherein the signal-generating member supplies the test firing channel with a test firing signal only when an indicating signal has been delivered by the indicating channel of the checked semiconductor position.

18. A device according to claim 12, wherein the signal-generating member supplies the firing channel of the semiconductor position with a test firing signal with reduced power.

* * * * *